(12) United States Patent
Song et al.

(10) Patent No.: US 12,393,097 B2
(45) Date of Patent: Aug. 19, 2025

(54) IMAGE RESOLUTION ENHANCING CARRYING FRAME, CAMERA MODULE AND ELECTRONIC DEVICE

(71) Applicant: TRIPLE WIN TECHNOLOGY(SHENZHEN) CO. LTD., Shenzhen (CN)

(72) Inventors: Jian-Chao Song, Guangdong (CN); Yu-Shuai Li, Shenzhen (CN); Kun Li, Guangdong (CN); Ding Feng, Jincheng (CN); Wu-Tong Wang, Jincheng (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 462 days.

(21) Appl. No.: 17/898,966

(22) Filed: Aug. 30, 2022

(65) Prior Publication Data
US 2023/0384648 A1 Nov. 30, 2023

(30) Foreign Application Priority Data
May 26, 2022 (CN) .......................... 202210589345.X

(51) Int. Cl.
*G03B 5/00* (2021.01)
*G03B 17/12* (2021.01)
*G03B 41/08* (2021.01)
*H05K 1/02* (2006.01)

(52) U.S. Cl.
CPC ............... *G03B 5/00* (2013.01); *G03B 17/12* (2013.01); *G03B 41/08* (2013.01); *H05K 1/0274* (2013.01)

(58) Field of Classification Search
CPC .......... G03B 5/00; G03B 17/12; G03B 41/08; H05K 1/0274; H05K 2201/09063; H05K 2201/10121; H05K 1/148
See application file for complete search history.

(56) References Cited

U.S. PATENT DOCUMENTS

| 11,467,476 | B2* | 10/2022 | Hirakura | G02B 26/0875 |
| 11,506,960 | B2* | 11/2022 | Chen | G03B 21/14 |
| 11,573,396 | B2* | 2/2023 | Smith | G03B 21/008 |
| 2022/0137493 | A1 | 5/2022 | Chen et al. | |

FOREIGN PATENT DOCUMENTS

| CN | 114285973 A | 4/2022 |
| CN | 114509907 A | 5/2022 |

* cited by examiner

*Primary Examiner* — Ahmed A Berhan
(74) *Attorney, Agent, or Firm* — ScienBiziP, P.C.

(57) ABSTRACT

A carrying frame includes a main body, a first rotating part, a second rotating part, and a driving part. The main body includes a first inner surface which defines a first through hole. The first rotating part is mounted on the first inner surface and comprises a second inner surface which defines a second through hole. The second rotating part is mounted on the second inner surface and comprises a third through hole. The driving part is configured to drive at least one of the first rotating part to rotate in a first direction and the second rotating part to rotate in a second direction. The first direction and the second direction are perpendicular to each other, and both the first direction and the second direction are parallel to a plane where the main body is located. A camera module and an electronic device are also provided.

20 Claims, 8 Drawing Sheets

IMAGE RESOLUTION ENHANCING CARRYING FRAME, CAMERA MODULE AND ELECTRONIC DEVICE

FIELD

The subject matter herein generally relates to fields of electronics and optical components, and in particular, to a carrying frame, a camera module having the carrying frame and an electronic device having the camera module.

BACKGROUND

With the development of image processing technology, the resolution of cameras has become higher and higher. In order to increase the pixels of the camera, a photosensitive chip with more photosensitive units can be used. However, as the number of photosensitive units increases, the production process of the photosensitive chip becomes more complicated, which results in a higher production cost.

BRIEF DESCRIPTION OF THE DRAWINGS

Implementations of the present disclosure will now be described, by way of embodiments, with reference to the attached figures.

DETAILED DESCRIPTION

Figure 1A:
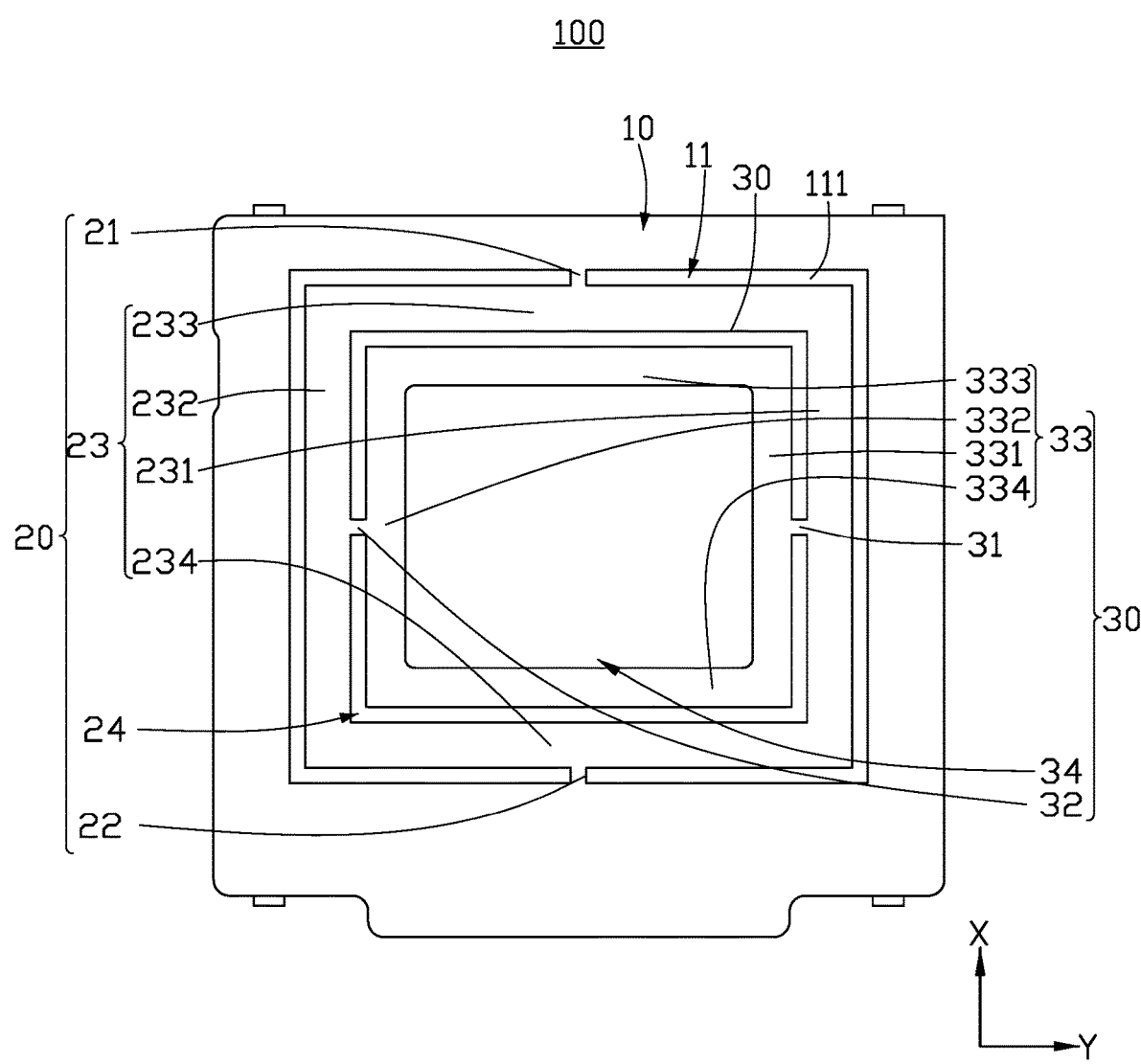
FIG. 1A is a schematic front view of an embodiment of a carrying frame according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Resolution refers to the number of maximum pixels (i.e., photosensitive units) of the photosensitive chip in the camera module that can be used for imaging. It is usually measured by the product of the number of horizontal pixels and the number of vertical pixels, that is, resolution=the number of horizontal pixels×the number of vertical pixels.

Pixel refers to the smallest unit that constitutes the imaging area of the photosensitive chip. Wherein, the pixel size refers to the physical size of the pixel, that is, the distance between the centers of adjacent pixels.

The photosensitive chip includes a plurality of photosensitive units, and each photosensitive unit corresponds to a pixel. The more pixels, the more details of the object that the photosensitive chip can sense, and the clearer the image. It should be noted that under the same photosensitive area, the resolution and the pixel size are trade-offs. Increasing the resolution requires adding more pixels in the same photosensitive area. As in the background art, under the same photosensitive area, the more photosensitive units there are in the photosensitive chip, the more complicated the production process and the higher the required production cost.

Therefore, the embodiments of the present disclosure provide a carrying frame, an optical assembly, a camera module, and an electronic device. The carrying frame, the optical assembly, the camera module, and the electronic device may improve the resolution and save costs without using more photosensitive units.

Figure 1B:
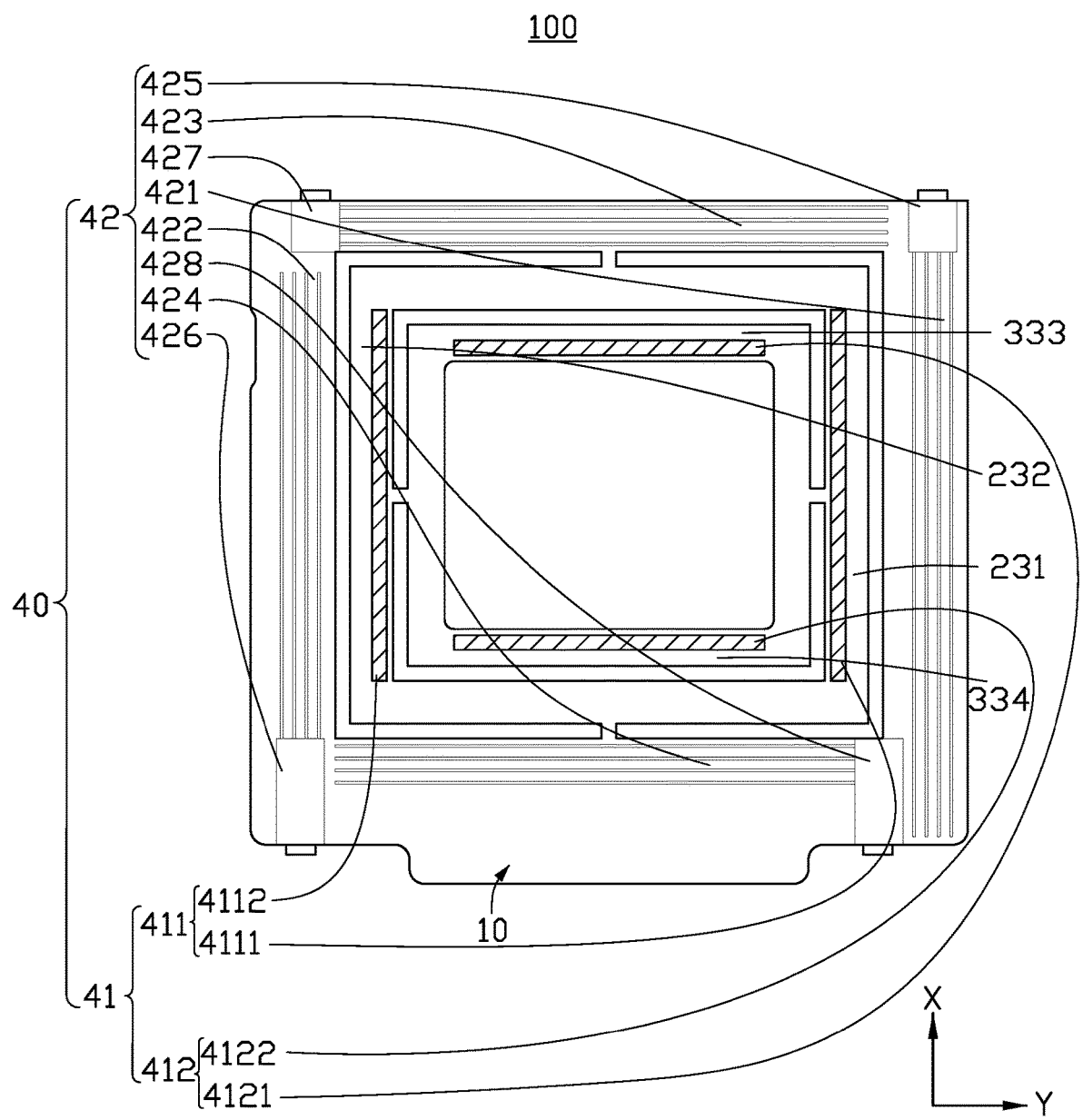
FIG. 1B is a schematic back view of an embodiment of a carrying frame according to the present disclosure.

FIG. 1A is a schematic front view of an embodiment of a carrying frame. FIG. 1B is a schematic back view of an embodiment of a carrying frame. Referring to FIGS. 1A and 1B, the carrying frame 100 may be used to carry an optical component 201 (shown in FIG. 3), and may be applied in a camera module 300 (shown in FIG. 4). A front side of the carrying frame 100 faces the optical component 201, and a back side of the carrying frame 100 facing away from the front side faces a photosensitive chip 302 (shown in FIG. 4).

In at least one embodiment, the carrying frame 100 includes a main body 10, a first rotating part 20, a second rotating part 30, and a driving part 40. The first rotating part 20, the second rotating part 30, and the driving part 40 are arranged on the main body 10. The first rotating part 20 can rotate in a first direction, the second rotating part 30 can rotate in a second direction. The driving part 40 drives the first rotating part 20 to rotate in the first direction, so that the first rotating part 20 is offset with respect to a plane where the main body 10 is located. The driving part 40 drives the second rotating part 30 to rotate in the second direction, so that the second rotating part 30 is offset with respect to the plane where the main body 10 is located. The first direction and the second direction are perpendicular to each other, and both the first direction and the second direction are parallel to the plane where the main body 10 is located.

In FIGS. 1A and 1B, the first direction is defined as X, the second direction is defined as Y. The first direction and the second direction in the FIGS. 1A and 1B are only examples, which are not limited in the present disclosure. For example, in at least one embodiment, the first direction may be a direction as Y, the second direction may be a direction as X.

In at least one embodiment, the carrying frame may further include a first through hole 11. The first through hole 11 penetrates the main body 10 in a third direction. The camera module 300 finds a view and captures light through the first through hole 11. A shape of the first through hole 11 may be circular, rectangular, or determined according to a shape of the optical component 201.

In at least one embodiment, the main body 10 may be in a square, rectangular, circular, or oval shape or be in other shapes matching the camera module 300. The main body 10 may be a metal sheet, such as pure metal, stainless steel, alloy, or the like.

In at least one embodiment, the first rotating part 20 includes a first rotating shaft 21, a second rotating shaft 22, and a first frame 23. The first rotating shaft 21, the second rotating shaft 22, and the first frame 23 are all located in the first through hole 11.

The first rotating shaft 21 and the second rotating shaft 22 are mounted on an inner surface defining the first through hole 11, and the first rotating shaft 21 and the second rotating shaft 22 are oppositely arranged. The first rotating shaft 21 is connected between the main body 10 and the first frame 23, the second rotating shaft 22 is connected between the main body 10 and the first frame 23.

In at least one embodiment, the first rotating shaft 21 and the second rotating shaft 22 are mounted on the inner surface defining the first through hole 11 along the first direction, that is, the first rotating shaft 21 and the second rotating shaft 22 are on a straight line, and the straight line is parallel to the first direction. So that the first frame 23 can rotate around the first rotating shaft 21 and the second rotating shaft 22, that is, the first frame 23 can rotate around the first direction.

A second through hole 24 is formed in the middle of the first frame 23. The camera module 300 can use the second through hole 24 for finding a view and capturing light. A shape of the second through hole 24 may be circular, rectangular or determined according to the shape of the optical component 201.

In at least one embodiment, the first frame 23 includes a first portion 231, a second portion 232, a third portion 233, and a fourth portion 234. The first portion 231 and the second portion 232 are arranged opposite to each other along the second direction. The third portion 233 and the fourth portion 234 are arranged opposite to each other along the first direction. Specifically, the second through hole 24 is surrounded by the first portion 231, the third portion 233, the second portion 232, and the fourth portion 234 which are connected in sequence.

Referring to FIG. 1A, the third portion 233 is connected to the main body 10 through the first rotating shaft 21, the fourth portion 234 is connected to the main body 10 through the second rotating shaft 22.

In at least one embodiment, the second rotating part 30 includes a third rotating shaft 31, a fourth rotating shaft 32, and a second frame 33. The third rotating shaft 31, the fourth rotating shaft 32, and the second frame 33 are all located in the second through hole 24.

The third rotating shaft 31 and the fourth rotating shaft 32 are mounted on an inner surface defining the second through hole 24, and the third rotating shaft 31 and the fourth rotating shaft 32 are oppositely arranged. The third rotating shaft 31 is connected between the first frame 23 and the second frame 33, the fourth rotating shaft 32 is connected between the first frame 23 and the second frame 33.

In at least one embodiment, the third rotating shaft 31 and the fourth rotating shaft 32 are mounted on the inner surface defining the second through hole 24 along the second direction, that is, the third rotating shaft 31 and the fourth rotating shaft 32 are on a straight line, and the straight line is parallel to the second direction. So that the second frame 33 can rotate around the third rotating shaft 31 and the fourth rotating shaft 32, that is, the second frame 33 can rotate around the second direction.

A third through hole 34 is formed in the middle of the second frame 33. The camera module 300 can use the third through hole 34 for finding a view and capturing light. A shape of the third through hole 34 may be circular, rectangular or determined according to the shape of the optical component 201.

In at least one embodiment, the second frame 33 includes a fifth portion 331, a sixth portion 332, a seventh portion 333, and an eighth portion 334. The fifth portion 331 and the sixth portion 332 are arranged opposite to each other along the second direction. The seventh portion 333 and the eighth portion 334 are arranged opposite to each other along the first direction. Specifically, the third through hole 34 is surrounded by the fifth portion 331, the seventh portion 333, the sixth portion 332, and the eighth portion 334 which are connected in sequence.

Referring to FIG. 1A, the fifth portion 331 is connected to the first portion 231 of the first frame 23 through the third rotating shaft 31, the sixth portion 332 is connected to the second portion 232 of the first frame 23 through the fourth rotating shaft 32.

In at least one embodiment, the second frame 33 is used to carry the optical component 201, and the second frame 33 can drive the optical component 201 to rotate in the second direction. Further, since the second frame 33 is connected to the first frame 23 through the third rotating shaft 31 and the fourth rotating shaft 32, when the first frame 23 rotates in the first direction, the first frame 23 drives the second frame 33 to rotate in the first direction, and then the second frame 33 drives the optical component 201 to rotate in the first direction.

In at least one embodiment, the first rotating shaft 21, the second rotating shaft 22, the third rotating shaft 31, and the fourth rotating shaft 32 may be internally inlaid with shrapnel, for example, the shrapnel may be embedded inside by nano-injection, to restrict the position of the first rotating part 20 and the second rotating part 30 when the driving part 40 drives the first rotating part 20 and the second rotating part 30 to rotate, and restore the position of the first rotating part 20 and the second rotating part 30 when the driving part 40 stops driving the first rotating part 20 and the second rotating part 30 to rotate.

In at least one embodiment, the main body 10, the first rotating part 20, and the second rotating part 30 may be integrally formed by nano-injection.

In at least one embodiment, referring to FIGS. 1A and 1B, the first through hole 11, the first frame 23, the second through hole 24, the second frame 33, and the third through hole 34 are all rectangular. It can be understood that the first through hole 11, the first frame 23, the second through hole 24, the second frame 33, and the third through hole 34 may have other shapes, and the shapes of the first through hole 11, the first frame 23, the second through hole 24, the second frame 33, and the third through hole 34 may be different.

The driving part 40 includes a rotating assembly 41 and a driving assembly 42. Referring to FIG. 1B, the driving part 40 is arranged on a reverse side of the carrying frame 100. The driving assembly 42 may be arranged on the main body 10. The rotating assembly 41 may be arranged on the first rotating part 20 and the second rotating part 30. The driving assembly 42 is disposed correspondingly to the rotating assembly 41, the rotating assembly 41 drives the first rotating part 20 and the second rotating part 30 to rotate under the driving the driving assembly 42.

In at least one embodiment, the driving assembly 42 drives the rotating assembly 41 by electromagnetic, and the driving assembly 42 cooperates with the rotating assembly 41 to drive the first rotating part 20 and the second rotating part 30 to shake and tilt in a preset direction and reach a preset angle.

The rotating assembly 41 includes a first rotating component 411 and a second rotating component 412. The first rotating component 411 is arranged on the first rotating part 20 for driving the first rotating part 20 to rotate in the first direction. The second rotating component 412 is arranged on the second rotating part 30 for driving the second rotating part 30 to rotate in the second direction. For example, the first rotating component 411 is arranged on the first frame 23, and the second rotating component 412 is arranged on the second frame 33.

In at least one embodiment, the first rotating component 411 and the second rotating component 412 may be magnetic components respectively, and the magnetic components can respond to the magnetic field, for example, the magnetic components may be subjected to force in the magnetic field to drive the first rotating part 20 and the second rotating part 30 to rotate. The magnetic components may be magnetics.

In at least one embodiment, the first rotating component 411 includes a first magnet 4111, and the first magnet 4111 may be arranged on the first portion 231 or the second portion 232. The first rotating component 411 may further include a second magnet 4112. If the first magnet 4111 is arranged on the first portion 231, the second magnet 4112 is arranged on the second portion 232. If the first magnet 4111 is arranged on the second portion 232, the second magnet 4112 is arranged on the first portion 231.

In at least one embodiment, the second rotating component 412 includes a third magnet 4121, and the third magnet 4121 may be arranged on the seventh portion 333 or the eighth portion 334. The second rotating component 412 may further include a fourth magnet 4122. If the third magnet 4121 is arranged on the seventh portion 333, the fourth magnet 4122 is arranged on the eighth portion 334. If the third magnet 4121 is arranged on the eighth portion 334, the fourth magnet 4122 is arranged on the seventh portion 333.

The driving assembly 42 includes a coil (not shown) on the main body 10. Based on the magnetic effect of the current, the coil generates a magnetic field when energized. For example, when a current is passed through a straight metal wiring line, a circular magnetic field will be created in the space around the straight metal wiring line. The greater the current flowing through the wiring line, the stronger the magnetic field produced. The magnetic field forms a circle around the wiring line. It can be understood that the magnetic component may respond to the magnetic field, for example, the magnetic component may be subjected to force in the magnetic field and then displaced.

In at least one embodiment, the driving assembly 42 includes a first coil 421, a second coil 422, a third coil 423, and a fourth coil 424. The first coil 421 corresponds to and is adjacent to the first magnet 4111, the second coil 422 corresponds to and is adjacent to the second magnet 4112, the third coil 423 corresponds to and is adjacent to the third magnet 4121, the fourth coil 424 corresponds to and is adjacent to the fourth magnet 4122.

Referring to FIG. 1B, the first coil 421 corresponding to the first magnet 4111 is arranged on the main body 10, the second coil 422 corresponding to the second magnet 4112 is arranged on the main body 10. The first coil 421 and the second coil 422 correspond to each other and are spaced along the second direction Y. The third coil 423 corresponding to the third magnet 4121 is arranged on the main body 10, the fourth coil 424 corresponding to the fourth magnet 4122 is arranged on the main body 10. The third coil 423 and the fourth coil 424 correspond to each other and are spaced along the first direction X. When the first coil 421 is energized, the first magnet 4111 is subjected to force in the magnetic field generated by the first coil 421 to drive the first frame 23 to tilt. When the second coil 422 is energized, the second magnet 4112 is subjected to force in the magnetic field generated by the second coil 422 to drive the first frame 23 to tilt. When the third coil 423 is energized, the third magnet 4121 is subjected to force in the magnetic field generated by the third coil 423 to drive the second frame 33 to tilt. When the fourth coil 424 is energized, the fourth magnet 4122 is subjected to force in the magnetic field generated by the fourth coil 424 to drive the second frame 33 to tilt.

In at least one embodiment, the driving assembly 42 may further include pins (not shown) and a logic gate (not shown), the logic gate is connected to the coil through the pins to control whether the coil is energized or not, so as to control the coil to generate a magnetic field. In at least one embodiment, the logic gate may be arranged on a circuit board 301 (shown in FIG. 3) of the camera module 300.

In at least one embodiment, the driving assembly 42 may further include a first pin 425, a second pin 426, a third pin 427, and a fourth pin 428. The first pin 425, the second pin 426, the third pin 427, and the fourth pin 428 are respectively connected to the logic gate. Referring to FIG. 1B, the first pin 425 is connected to the first coil 421, the second pin 426 is connected to the second coil 422, the third pin 427 is connected to the third coil 423, and the fourth pin 428 is connected to the fourth coil 424.

In at least one embodiment, the logic gate may control the first rotating component 411 to drive the first rotating part 20 to perform a first action and a second action in the first direction X. For example, the first action may be that the first rotating part 20 shakes and tilts to the left, and a first deflection angle is formed between the first rotating part 20 and the main body 10. The second action may be that the first rotating part 20 shakes and tilts to the right, and a second deflection angle is formed between the first rotating part 20 and the main body 10. An optical path of the optical component 201 on the first rotating part 20 may be changed to move to the left by the leftward shaking and tilting of the first rotating part 20. Correspondingly, when the first rotating part 20 shakes and tilts to the right, the optical path of the optical component 201 may move to the right.

In at least one embodiment, when the first rotating part 20 performs the first action, the second portion 232 of the first frame 23 may move upward, and the first portion 231 of the first frame 23 may move downward. In at least one embodiment, when the first rotating part 20 performs the second action, the second portion 232 of the first frame 23 may move downward, and the first portion 231 of the first frame 23 may move upward. The first action and the second action may be adjusted according to the refraction and the reflection of the light by the optical component 201.

In at least one embodiment, to control the first rotating part 20 to perform the first action, the logic gate may control the first coil 421 to be electrified, the second coil 422 to be electrified, or the first coil 421 and the second coil 422 to be electrified at the same time.

In at least one embodiment, to control the first rotating part 20 to perform the second action, the logic gate may control the first coil 421 to be electrified, the second coil 422 to be electrified, or the first coil 421 and the second coil 422 to be electrified at the same time.

In at least one embodiment, the logic gate may control the second rotating component 412 to drive the second rotating part 30 to perform a third action and a fourth action in the second direction Y. For example, the third action may be that the second rotating part 30 shakes and tilts upward, and a third deflection angle is formed between the second rotating part 30 and the main body 10. The fourth action may be that the second rotating part 30 shakes and tilts downward, and a fourth deflection angle is formed between the second rotating part 30 and the main body 10. The optical path of the optical component 201 on the first rotating part 20 may be changed to move upward by the upward shaking and tilting of the second rotating part 30. Correspondingly, when the second rotating part 30 shakes and tilts downward, the optical path of the optical component 201 may move downward.

In at least one embodiment, when the second rotating part 30 performs the third action, the seventh portion 333 of the second frame 33 may move downward, and the eighth portion 334 of the second frame 33 may move upward. In at least one embodiment, when the second rotating part 30 performs the fourth action, the seventh portion 333 of the second frame 33 may move upward, and the eighth portion 334 of the second frame 33 may move downward. The third action and the fourth action may be adjusted according to the refraction and the reflection of the light by the optical component 201.

In at least one embodiment, to control the second rotating part 30 to perform the third action, the logic gate may control the third coil 423 to be electrified, the fourth coil 424 to be electrified, or the third coil 423 and the fourth coil 424 to be electrified at the same time.

In at least one embodiment, to control the second rotating part 30 to perform the fourth action, the logic gate may control the third coil 423 to be electrified, the fourth coil 424 to be electrified, or the third coil 423 and the fourth coil 424 to be electrified at the same time.

In at least one embodiment, the logic gate may pre-store driving waveforms corresponding to the first action, the second action, the third action, and the fourth action, and may drive the coil by outputting the driving waveform to the pins corresponding to the coil. The logic gate outputs the driving waveforms to the driving assembly 42 to control the operation of the driving assembly 42, and then the first rotating part 20 and the second rotating part 30 are controlled by the driving assembly 42 to perform actions corresponding to the driving waveforms.

In at least one embodiment, the corresponding driving waveforms may be set according to the driving situation of the driving assembly 42 to the rotating assembly 41, so that the logic gate may change the optical path of the light passing through the optical component 201, the light passing through the optical component 201 may move up, right, down, or left, or may move in the order of up→right→down→left.

In at least one embodiment, to control the light passing through the optical component 201 to move in the order of up→right→down→left, the logic gate may control the energization of the first coil 421, the second coil 422, the third coil 423, and the fourth coil 424 at the same time. How to realize the movement of the light is not specifically limited in the present disclosure.

The working principle of the carrying frame 100 will be specifically described below.

Figure 2A:
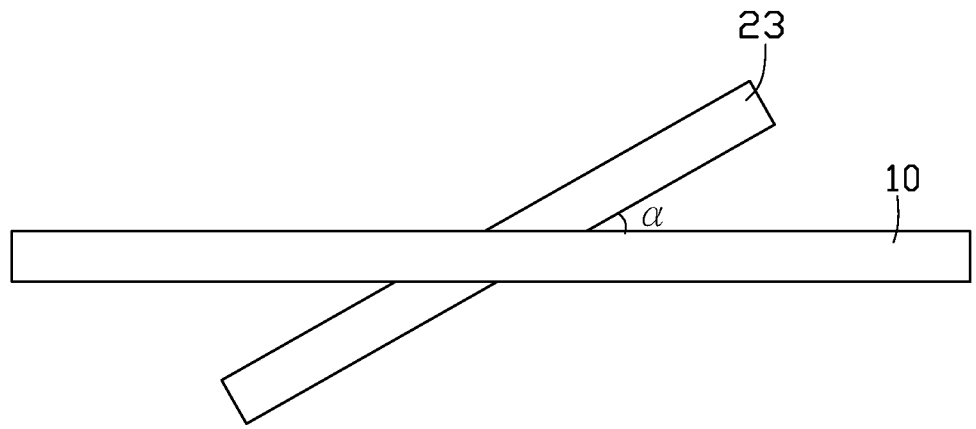
FIG. 2A is a diagram of an embodiment of a first deflection formed between a first frame of a carrying frame and a main body of carrying frame according to the present disclosure.
Figure 2B:
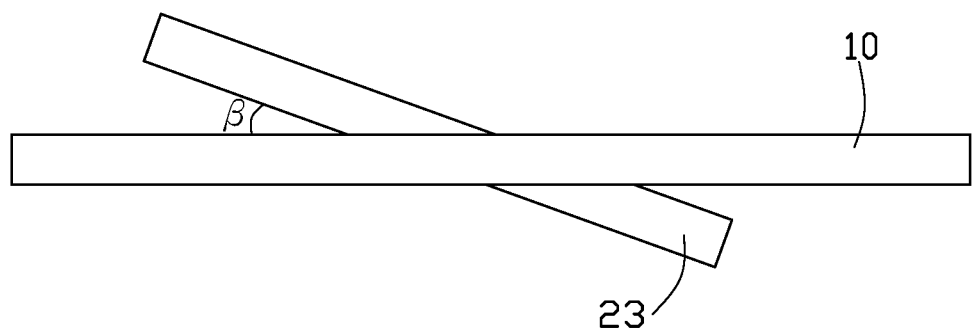
FIG. 2B is a diagram of an embodiment of a second deflection formed between a first frame of a carrying frame and a main body of carrying frame according to the present disclosure.

The logic gate outputs the driving waveform corresponding to the first action to tilt the first frame 23 to the left, as shown in FIG. 2A, so that a first deflection a is formed between a plane where the first frame 23 is located and a plane where the main body 10 is located. The logic gate outputs the driving waveform corresponding to the second action to tilt the first frame 23 to the right, as shown in FIG. 2B, so that a second deflection is formed between the plane where the first frame 23 is located and the plane where the main body 10 is located. Correspondingly, the logic gate outputs the driving waveform corresponding to the third action to tilt the second frame 33 upward, and a deflection angle is formed between a plane where the second frame 33 is located and a plane where the main body 10 is located. The logic gate outputs the driving waveform corresponding to the fourth action to tilt the second frame 33 downward, and a deflection angle is formed between the plane where the second frame 33 is located and the plane where the main body 10 is located.

In at least one embodiment, the deflection of the optical component 201 can be controlled by the carrying frame 100, the deflected optical component 201 can change the optical path, so that the light passing through the optical component 201 can be adjusted according to the deflection angle of the optical component 201, thereby adjusting the light incident on the photosensitive chip 302. By controlling the rotation of the first rotating part 20 and the second rotating part 30, the light can move, so that the photosensitive chip 302 can obtain different images. After moving for many times, multiple images can be obtained, the desired high-resolution image can be obtained from the multiple images.

Figure 3:
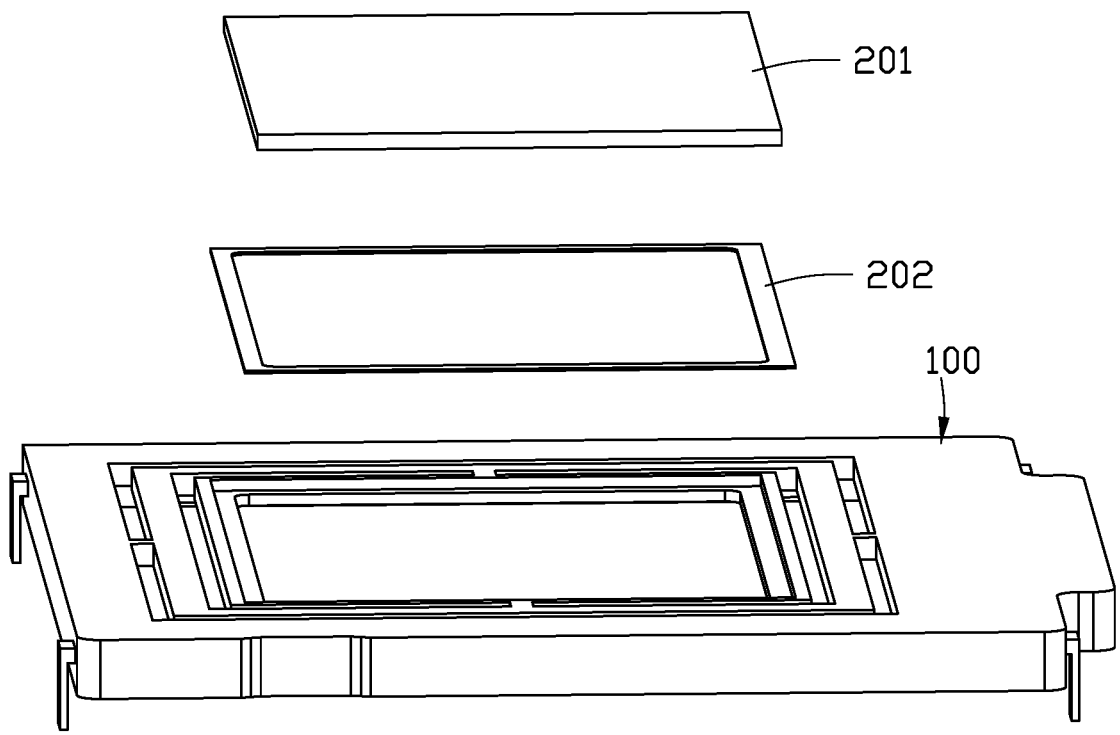
FIG. 3 is an exploded, diagrammatic view of an embodiment of an optical component according to the present disclosure.

FIG. 3 is an exploded diagrammatic view of an embodiment of an optical assembly 200. Referring to FIG. 3, the optical assembly 200 includes an optical component 201 and the above carrying frame 100. The optical component 201 is arranged on a first surface of the carrying frame 100.

In at least one embodiment, the optical component 201 is used for passing light in a specific wavelength range.

In at least one embodiment, the optical component 201 may be made of glass. In at least one embodiment, the optical component 201 may be a galvanometer to filter reflected light and eliminate polarized light. In at least one embodiment, the optical component 201 may be a filter, and the filter may be an infrared filter. Specifically, the infrared filter may be a white glass infrared filter, a blue glass infrared filter, or a blue resin infrared filter.

In at least one embodiment, the optical component 201 may further includes a first adhesive layer 202, the first adhesive layer 202 is arranged on a side of the second frame 33 facing away from the photosensitive chip 302 (that is, the side of the second frame 33 is the front side of the carrying frame 100), the optical component 201 is adhered to the second frame 33 through the first adhesive layer 202.

In at least one embodiment, the second frame 33 includes a third through hole 34, the light passing through the optical component 201 can incident on the photosensitive chip 302 through the third through hole 34.

Figure 4:
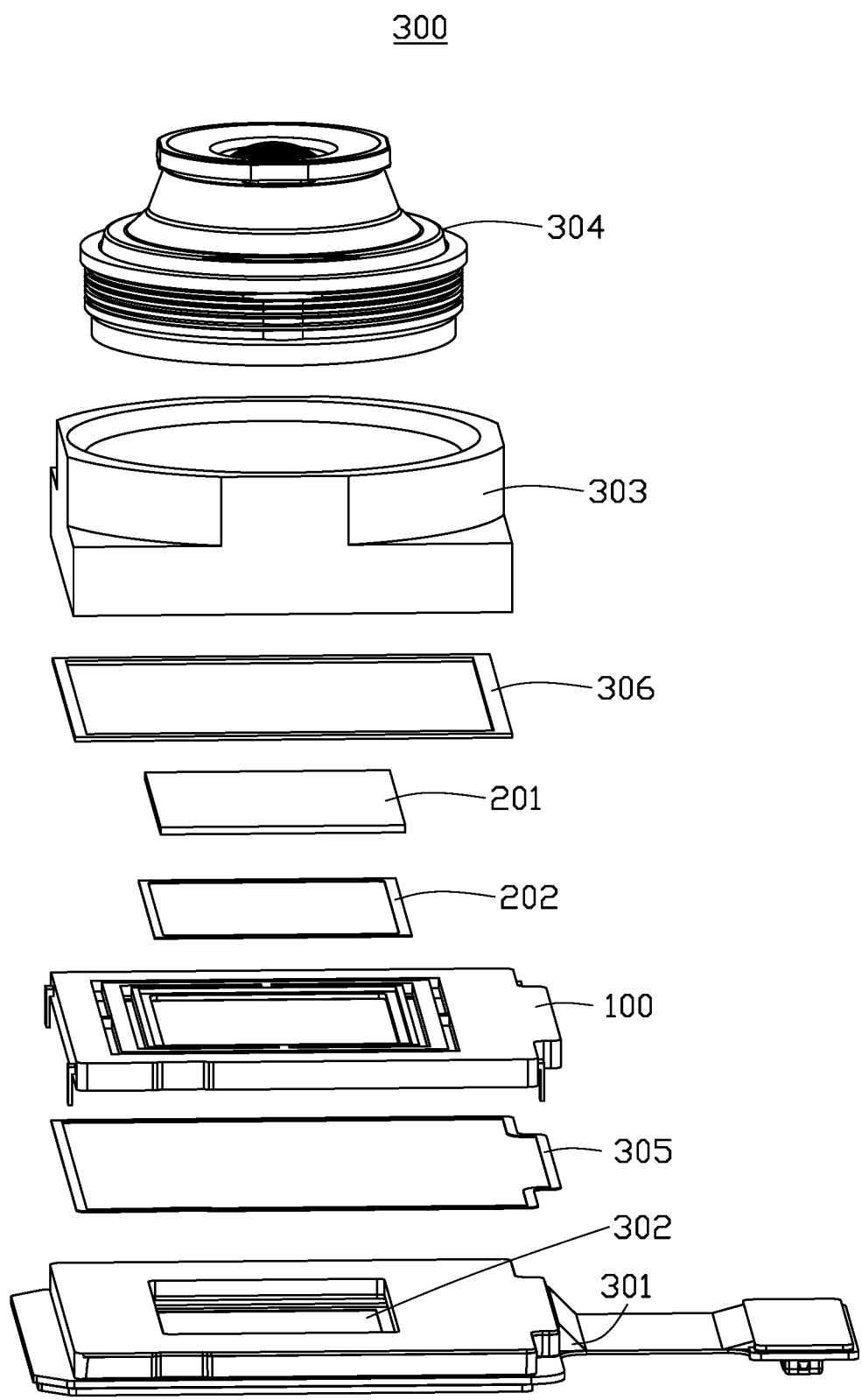
FIG. 4 is an exploded, diagrammatic view of an embodiment of a camera module according to the present disclosure.

FIG. 4 illustrates an embodiment of a camera module 300. The camera module 300 includes a circuit board 301, a photosensitive chip 302, the above carrying frame 100, an optical component 201, a lens holder 303, and a lens 304 arranged in sequence. The photosensitive chip 302 and the carrying frame 100 are mounted on the circuit board 301, the photosensitive chip 302 is surrounded by the circuit board 301 and the carrying frame 100. The optical component 201 is mounted on the carrying frame 100. The lens holder 303 is mounted on the carrying frame 100 provided with the optical component 201. The lens 304 is mounted on the lens holder 303. The circuit board 301, the photosensitive chip 302, the optical component 201, the lens holder 303, and the lens 304 are conventional structures of the existing camera module and will not be described in detail.

In at least one embodiment, the camera module 300 may further include a first adhesive layer 202, a second adhesive layer 305, and a third adhesive layer 306. The second adhesive layer 305 is arranged on the circuit board 301, the carrying frame 100 is adhered to the circuit board 301 through the second adhesive layer 305. The optical component 201 is adhered to the second frame 33 through the first adhesive layer 202. The third adhesive layer 306 is arranged on the carrying frame 100, the lens holder 303 is adhered to the carrying frame 100 through the third adhesive layer 306.

In at least one embodiment, the light reflected by the photographed object enters the lens 304 to be captured by the lens 304. The optical component 201 filters the light captured by the lens 304. The light passing through the optical component 201 passes through the third through hole 34 and is incident on the photosensitive chip 302. The photosensitive chip 302 includes a plurality of photosensitive units (not shown), the photosensitive units receive light and then process imaging.

Figure 5:
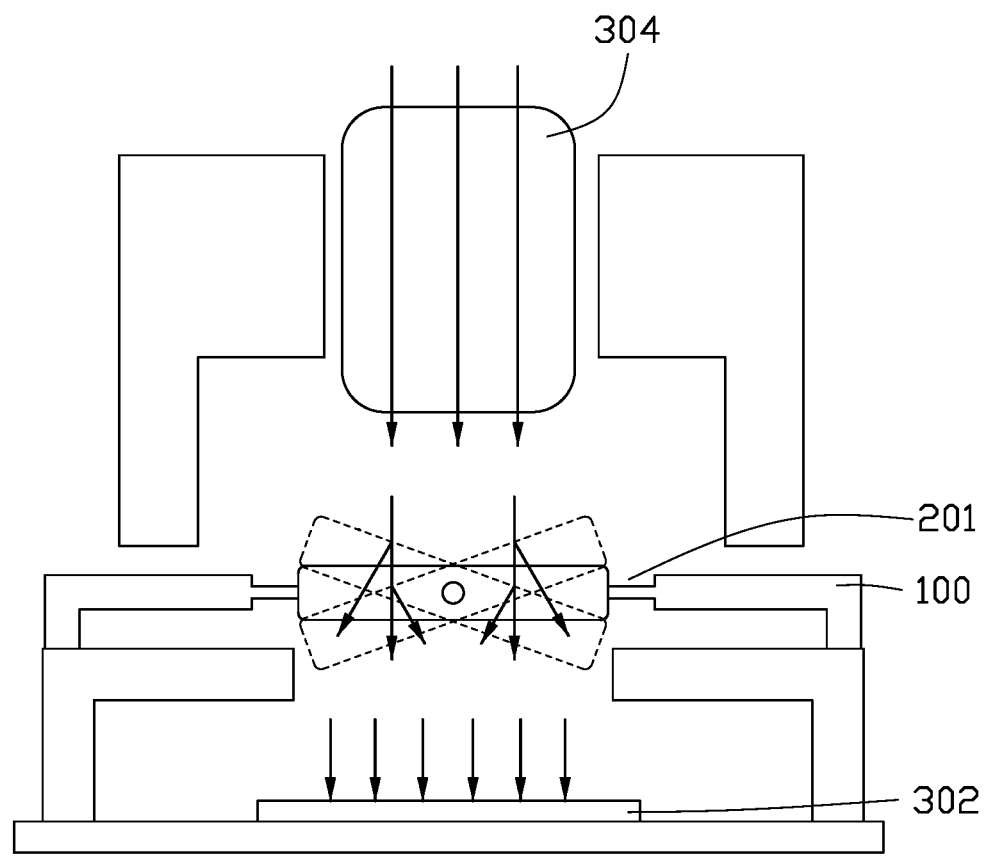
FIG. 5 is a diagram of an embodiment of an use state of a camera module according to the present disclosure.

The working principle of the above carrying frame 100 in the camera module 300 will be described in detail with reference to FIGS. 5 and 6. It can be understood that the connection relationship between the lens 304, the optical component 201, the carrying frame 100, and the photosensitive chip 302 in FIG. 5 is only an example.

For example, the light passing through the lens 304 is vertically incident on the optical component 201. As shown in FIG. 5, the light reflected by the photographed object is incident on the lens 304, when the optical component 201 is not tilted by the carrying frame 100, the optical component 201 is parallel to a plane where the carrying frame 100 is located, the light passing through the lens 304 is vertically incident on the optical component 201, the light passing through the optical component 201 is vertically incident on the photosensitive chip 302. When the optical component 201 is \tilted by the carrying frame 100, the light passing through the lens 304 is vertically incident on the optical component 201, and the light is incident on the photosensitive chip 302 at an oblique angle by the optical component 201, that is, the light passing through the optical component 201 is incident on the photosensitive chip 302 at the oblique angle. In this way, the rotation of the optical component 201 is controlled by the carrying frame 100, so that a deflection angle is formed between the optical component 201 and the plane where the carrying frame 100 is located. By controlling the deflection angle of the optical component 201, an exposure timing corresponds to the deflection angle of the optical component 201. Different deflection angles correspond to different images, in other words, multiple images may be obtained by deflecting the optical component 201, and a desired high-resolution image can be obtained based on the multiple images.

Figure 6A:
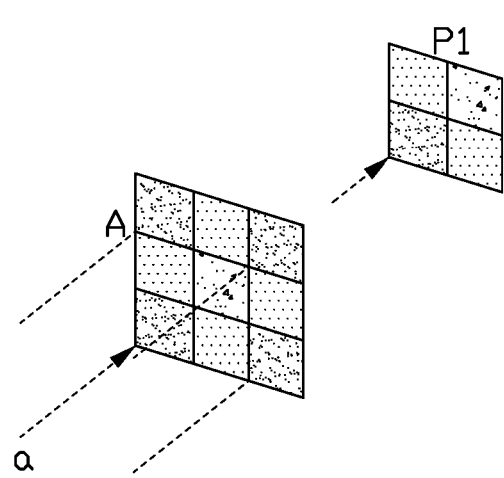
FIG. 6A is a diagram of an embodiment of light incident on a photosensitive chip according to the present disclosure.
Figure 6B:
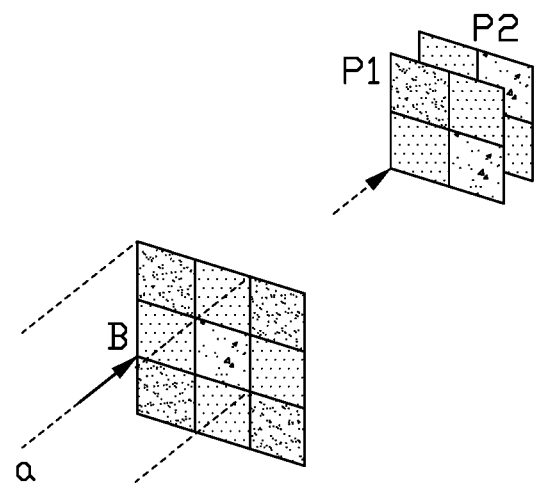
FIG. 6B is a diagram of an embodiment of light incident on a photosensitive chip according to the present disclosure.
Figure 6C:
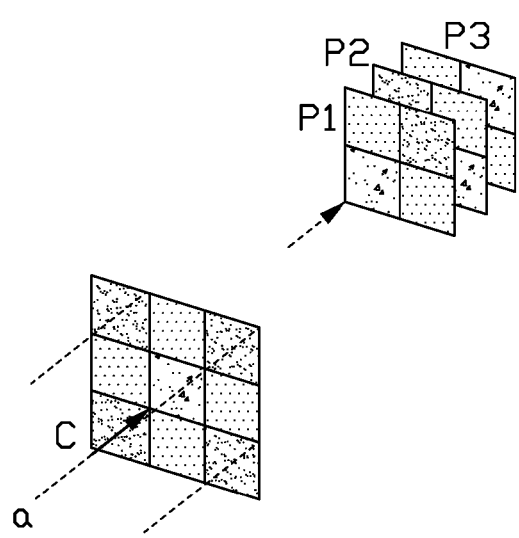
FIG. 6C is a diagram of an embodiment of light incident on a photosensitive chip according to the present disclosure.
Figure 6D:
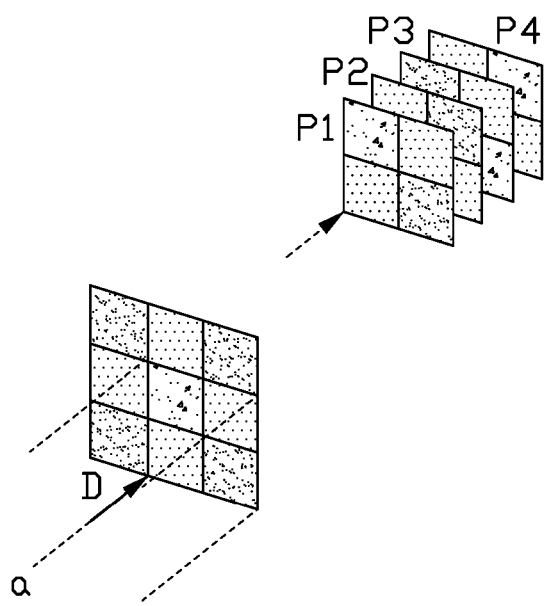
FIG. 6D is a diagram of an embodiment of light incident on a photosensitive chip according to the present disclosure.

Specifically, referring to FIG. 6A, when the optical component 201 is not controlled to be tilted by the carrying frame 100, the deflection angle between the optical component 201 and the plane where the carrying frame 100 is located is zero. The light a reflected by a photographed point P passes through the lens 304 and is incident on the optical component 201, the light a is incident on an area A (the area enclosed by the dotted line in FIG. 6A) of the photosensitive chip 302 by the optical component 201, the corresponding pixel in the area A receives the light a reflected by the photographed point P, and a first image P1 is generated by the photosensitive chip 302. Referring to FIG. 6B, when the optical component 201 is controlled to be tilted by the carrying frame 100, and a first deflection angle between the optical component 201 and the plane where the carrying frame 100 is located is formed. The light a reflected by the photographed point P passes through the lens 304 and is incident on the optical component 201, the light a is incident on an area B (the area enclosed by the dotted line in FIG. 6B) of the photosensitive chip 302 by the optical component 201, the corresponding pixel in the area B receives the light a reflected by the photographed point P, and the area B is located above the area A, that is, the light a is shifted to an upper area of the photosensitive chip 302 by the optical component 201, and a second image P2 is generated by the photosensitive chip 302. Referring to FIG. 6C, when the optical component 201 is controlled to be tilted by the carrying frame 100, and a second deflection angle between the optical component 201 and the plane where the carrying frame 100 is located is formed. The light a reflected by the photographed point P passes through the lens 304 and is incident on the optical component 201, the light a is incident on an area C (the area enclosed by the dotted line in FIG. 6C) of the photosensitive chip 302 by the optical component 201, the corresponding pixel in the area C receives the light a reflected by the photographed point P, and the area C is located at the upper right of the area A, that is, the light a is shifted to an upper right area of the photosensitive chip 302 by the optical component 201, and a third image P3 is generated by the photosensitive chip 302. Referring to FIG. 6D, when the optical component 201 is controlled to be tilted by the carrying frame 100, and a third deflection angle between the optical component 201 and the plane where the carrying frame 100 is located is formed. The light a reflected by the photographed point P passes through the lens 304 and is incident on the optical component 201, the light a is incident on an area D (the area enclosed by the dotted line in FIG. 6D) of the photosensitive chip 302 by the optical component 201, the corresponding pixel in the area D receives the light a reflected by the photographed point P, and the area D is located at the lower right of the area A, that is, the light a is shifted to a lower right area of the photosensitive chip 302 by the optical component 201, and a fourth image P4 is generated by the photosensitive chip 302.

A desired high-resolution image can be obtained according to the first image P1, the second image P2, the third image P3, and the fourth image P4. That is, by moving the optical component 201, more pixels of the photosensitive chip 302 can receive more details of the photographed point. Its technical principle refers to the XPR pixel displacement technology, the light incident on the photosensitive chip 302 is changed by changing the optical component 201, so that one frame of picture is divided into multiple projections, and the multiple projections are superimposed by the phenomenon of persistence of vision. When the image is projected on the screen, and the image moves quickly by half a pixel at a time in the order of up→right→down→left.

Figure 7:
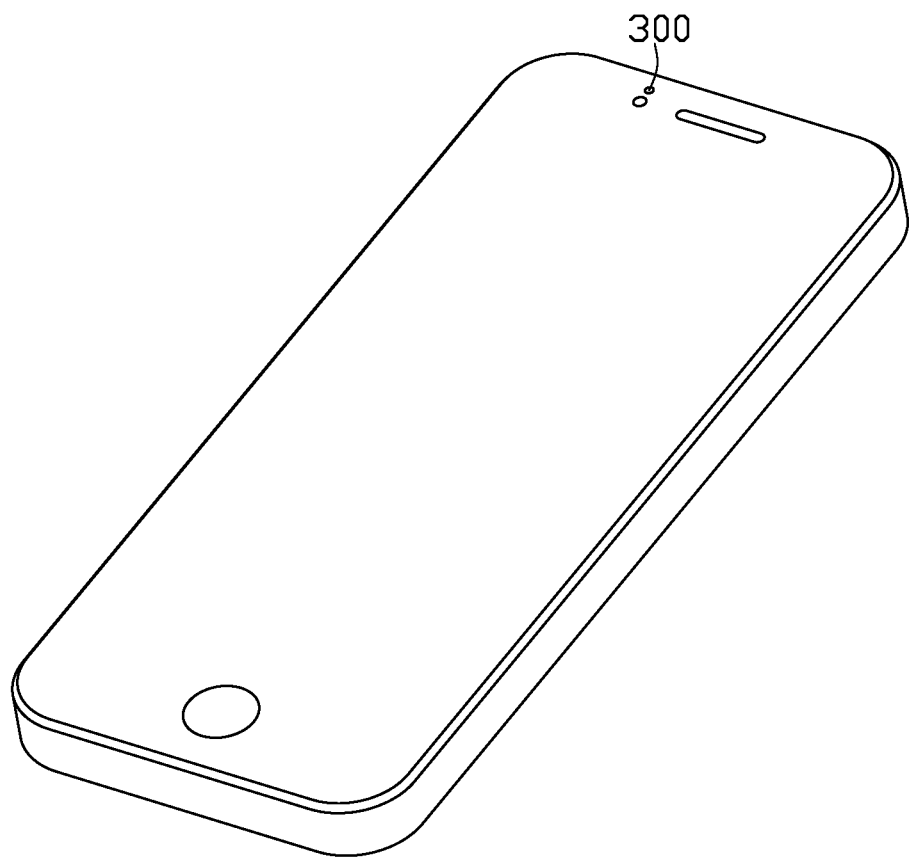
FIG. 7 is a diagram of an embodiment of an electronic device according to the present disclosure.

FIG. 7 illustrates an embodiment of an electronic device. The electronic device includes the above camera module 300. The electronic device may be, but not limited to, a mobile phone, a wearable device, a computer, a vehicle, or a monitoring device. In at least one embodiment, the electronic device is a mobile phone.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A carrying frame comprising:
a main body comprising a first inner surface which defines a first through hole;
a first rotating part mounted on the first inner surface, the first rotating part comprising a second inner surface which defines a second through hole;
a second rotating part mounted on the second inner surface, the second rotating part comprising a third through hole; and
a driving part configured to drive at least one of the first rotating part to rotate in a first direction and the second rotating part to rotate in a second direction, wherein the first direction and the second direction are perpendicular to each other, and both the first direction and the second direction are parallel to a plane where the main body is located.

2. The carrying frame of claim 1, wherein the first rotating part comprises a first rotating shaft, a second rotating shaft, and a first frame; the first rotating shaft and the second rotating shaft are mounted on the first inner surface, and the first rotating shaft and the second rotating shaft are oppositely arranged; the first rotating shaft is connected between the first inner surface and the first frame, and the second rotating shaft is connected between the first inner surface and the first frame.

3. The carrying frame of claim 2, wherein the second rotating part comprises a third rotating shaft, a fourth rotating shaft, and a second frame; the third rotating shaft and the fourth rotating shaft are mounted on the second inner surface, and the third rotating shaft and the fourth rotating shaft are oppositely arranged; the third rotating shaft is connected between the second inner surface and the second frame, and the fourth rotating shaft is connected between the second inner surface and the second frame.

4. The carrying frame of claim 3, wherein the driving part comprises a rotating assembly and a driving assembly; the rotating assembly is arranged on the first rotating part and the second rotating part, the driving assembly is arranged on the main body.

5. The carrying frame of claim 4, wherein the rotating assembly comprises a first rotating component and a second rotating component, the first rotating component is arranged on the first rotating part, the second rotating component is arranged on the second rotating part.

6. The carrying frame of claim 5, wherein the first rotating component comprises a first magnet and a second magnet, the first magnet and the second magnet are respectively arranged on both sides of the first rotating part in the second direction; the second rotating component comprises a third magnet and a fourth magnet, the third magnet and the fourth magnet are respectively arranged on both sides of the second rotating part in the first direction.

7. The carrying frame of claim 6, wherein the driving assembly comprises a first coil, a second coil, a third coil, and a fourth coil, the first coil corresponds to and is adjacent to the first magnet, the second coil corresponds to and is adjacent to the second magnet, the third coil corresponds to and is adjacent to the third magnet, the fourth coil corresponds to and is adjacent to the fourth magnet.

8. A camera module comprising:
a circuit board;
a photosensitive chip on the circuit board;
an optical component;
a lens holder;
a lens on the lens holder; and
a carrying frame on the circuit board, the carrying frame comprising;
a main body comprising a first inner surface to define a first through hole;
a first rotating part mounted on the first inner surface, the first rotating part comprising a second inner surface which defines a second through hole;
a second rotating part mounted on the second inner surface, the second rotating part comprising a third through hole; and
a driving part configured to drive at least one of the first rotating part to rotate in a first direction and the second rotating part to rotate in a second direction, wherein the first direction and the second direction are perpendicular to each other, and both the first direction and the second direction are parallel to a plane where the main body is located;
wherein the optical component is arranged on the carrying frame and corresponds to the third through hole, the photosensitive chip corresponds to the third through hole, and the optical component and the photosensitive chip are respectively arranged on both sides of the carrying frame; the lens holder is mounted on the side of the carrying frame with the optical component.

9. The camera module of claim 8, wherein the first rotating part comprises a first rotating shaft, a second rotating shaft, and a first frame; the first rotating shaft and the second rotating shaft are mounted on the first inner surface, and the first rotating shaft and the second rotating shaft are oppositely arranged; the first rotating shaft is connected between the first inner surface and the first frame, and the second rotating shaft is connected between the first inner surface and the first frame.

10. The camera module of claim 9, wherein the second rotating part comprises a third rotating shaft, a fourth rotating shaft, and a second frame; the third rotating shaft and the fourth rotating shaft are mounted on the second inner surface, and the third rotating shaft and the fourth rotating shaft are oppositely arranged; the third rotating shaft is connected between the second inner surface and the second frame, and the fourth rotating shaft is connected between the second inner surface and the second frame.

11. The camera module of claim 10, wherein the driving part comprises a rotating assembly and a driving assembly; the rotating assembly is arranged on the first rotating part and the second rotating part, the driving assembly is arranged on the main body.

12. The camera module of claim 11, wherein the rotating assembly comprises a first rotating component and a second rotating component, the first rotating component is arranged on the first rotating part, the second rotating component is arranged on the second rotating part.

13. The camera module of claim 12, wherein the first rotating component comprises a first magnet and a second magnet, the first magnet and the second magnet are respectively arranged on both sides of the first rotating part in the second direction; the second rotating component comprises a third magnet and a fourth magnet, the third magnet and the fourth magnet are respectively arranged on both sides of the second rotating part in the first direction.

14. The camera module of claim 13, wherein the driving assembly comprises a first coil, a second coil, a third coil, and a fourth coil, the first coil corresponds to and is adjacent to the first magnet, the second coil corresponds to and is adjacent to the second magnet, the third coil corresponds to and is adjacent to the third magnet, the fourth coil corresponds to and is adjacent to the fourth magnet.

15. An electronic device comprising:
a camera module comprising:
a circuit board;
a photosensitive chip on the circuit board;
an optical component;
a lens holder;
a lens on the lens holder; and
a carrying frame on the circuit board, the carrying frame comprising;
a main body comprising a first inner surface which defines a first through hole;
a first rotating part mounted on the first inner surface, the first rotating part comprising a second inner surface which defines a second through hole;
a second rotating part mounted on the second inner surface, the second rotating part comprising a third through hole; and
a driving part configured to drive at least one of the first rotating part to rotate in a first direction and the second rotating part to rotate in a second direction, wherein the first direction and the second direction are perpendicular to each other, and both the first direction and the second direction are parallel to a plane where the main body is located;
wherein the optical component is arranged on the carrying frame and corresponds to the third through hole, the photosensitive chip corresponds to the third through hole, and the optical component and the photosensitive chip are respectively arranged on both sides of the carrying frame; the lens holder is mounted on the side of the carrying frame with the optical component.

16. The electronic device of claim 15, wherein the first rotating part comprises a first rotating shaft, a second rotating shaft, and a first frame; the first rotating shaft and the second rotating shaft are mounted on the first inner surface, and the first rotating shaft and the second rotating shaft are oppositely arranged; the first rotating shaft is connected between the first inner surface and the first frame, and the second rotating shaft is connected between the first inner surface and the first frame.

17. The electronic device of claim 16, wherein the second rotating part comprises a third rotating shaft, a fourth rotating shaft, and a second frame; the third rotating shaft and the fourth rotating shaft are mounted on the second inner surface, and the third rotating shaft and the fourth rotating shaft are oppositely arranged; the third rotating shaft is connected between the second inner surface and the second frame, and the fourth rotating shaft is connected between the second inner surface and the second frame.

18. The electronic device of claim 17, wherein the driving part comprises a rotating assembly and a driving assembly; the rotating assembly is arranged on the first rotating part and the second rotating part, the driving assembly is arranged on the main body.

19. The electronic device of claim 18, wherein the rotating assembly comprises a first rotating component and a second rotating component, the first rotating component is arranged on the first rotating part, the second rotating component is arranged on the second rotating part.

20. The electronic device of claim 19, wherein the first rotating component comprises a first magnet and a second magnet, the first magnet and the second magnet are respectively arranged on both sides of the first rotating part in the second direction; the second rotating component comprises a third magnet and a fourth magnet, the third magnet and the fourth magnet are respectively arranged on both sides of the second rotating part in the first direction; the driving assembly comprises a first coil, a second coil, a third coil, and a fourth coil, the first coil corresponds to and is adjacent to the first magnet, the second coil corresponds to and is adjacent to the second magnet, the third coil corresponds to and is adjacent to the third magnet, the fourth coil corresponds to and is adjacent to the fourth magnet.

* * * * *